(12) United States Patent
Kilpinen

(10) Patent No.: US 12,187,605 B2
(45) Date of Patent: Jan. 7, 2025

(54) METHOD FOR ETCHING GAPS OF UNEQUAL WIDTH

(71) Applicant: MURATA MANUFACTURING CO., LTD., Nagaokakyo (JP)

(72) Inventor: Petteri Kilpinen, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 456 days.

(21) Appl. No.: 17/725,430

(22) Filed: Apr. 20, 2022

(65) Prior Publication Data

US 2022/0340415 A1 Oct. 27, 2022

(30) Foreign Application Priority Data

Apr. 22, 2021 (FI) ...................................... 20215472

(51) Int. Cl.
*B81C 1/00* (2006.01)

(52) U.S. Cl.
CPC ...... *B81C 1/00063* (2013.01); *B81C 1/00412* (2013.01); *B81C 2201/013* (2013.01); *B81C 2201/053* (2013.01)

(58) Field of Classification Search
CPC ..... H01L 21/30; H01L 21/46; B81C 1/00063; B81C 1/00412; B81C 2201/013; B81C 2201/053
See application file for complete search history.

(56) References Cited

U.S. PATENT DOCUMENTS 9,857,229 B1 * 1/2018 Steffanson .......... B81C 1/00142
2007/0026636 A1 2/2007 Gogoi
2016/0332872 A1 11/2016 Iihola et al.

FOREIGN PATENT DOCUMENTS

EP 2829512 A1 1/2015
WO WO 2019/115263 A1 6/2019

OTHER PUBLICATIONS

Search Report dated Aug. 16, 2022, corresponding European Application No. 22158484.
Kiihamaki J et al: "Depth and profile control in plasma etched MEMS structures", Sensors and Actuators A: Physical, Elsevier BV, NL, vol. 82, No. 1-3, May 1, 2000, pp. 234-238.
Finnish Search Report dated Dec. 21, 2021 corresponding to Finnish Patent Application No. 20215472.

* cited by examiner

*Primary Examiner* — Victor A Mandala
*Assistant Examiner* — Colleen E Snow
(74) *Attorney, Agent, or Firm* — SQUIRE PATTON BOGGS (US) LLP

(57) ABSTRACT

A method for manufacturing a micromechanical structure in the structural layer of a wafer by forming a first gap and a second gap depositing and patterning a first etching mask and a second etching mask on a horizontal face of the structural layer, etching trenches through the structural layer in the first and second unprotected areas which are not protected by the first etching mask or the second etching mask, coating at least the sidewalls of the trenches with a protective layer and removing the second etching mask at least from a second opening in the first etching mask, so that a temporarily protected area is exposed, and etching away the structural layer in the exposed temporarily protected area.

7 Claims, 7 Drawing Sheets

METHOD FOR ETCHING GAPS OF UNEQUAL WIDTH

FIELD OF THE DISCLOSURE

The present disclosure relates to micromechanical devices, and more particularly to etching methods for manufacturing micromechanical device structures in a wafer.

BACKGROUND OF THE DISCLOSURE

Microelectromechanical (MEMS) systems often comprise micromechanical structures formed in the structural layer of a device wafer by etching. These micromechanical parts can for example include mobile structures that are suspended with flexible suspenders from adjacent fixed parts of the structural layer. MEMS systems which comprise mobile micromechanical structures include, for example, acceleration sensors, gyroscopes, micromirrors, optical switches and scanners.

Micromechanical structures are created by separating some parts of the wafer from other parts, for example by etching a trench all the way through the structural layer so that a gap is formed between two structures. FIG. 1 illustrates schematically a structural layer 11 where structures 111-113 are separated from each other in the illustrated region. The micromechanical structures often include some (such as 111 and 112) which have to be separated from each other by a narrow gap 18, and others (such as 112 and 113) which have to be separated from each other by a significantly broader gap 19.

Deep-reactive ion etching (DRIE) is a common method for etching gaps and trenches in silicon wafers. When narrow gaps such as 18 and broad gaps such as 19 are etched in the same DRIE process, the sidewalls 191 of the broad gap 19 are often burdened by DRIE load effects such as striation. The structural damage caused by load effects can introduce measurement errors or cause short-circuits in the MEMS device. It would therefore be beneficial to perform a DRIE etch without producing load effects on the any sidewalls.

BRIEF DESCRIPTION OF THE DISCLOSURE

An object of the present disclosure is to provide a method for alleviating problems that result from DRIE load effects when narrow and wide gaps are etched simultaneously.

The object of the disclosure is achieved by a method which is characterized by what is stated in the independent claim. The preferred embodiments of the disclosure are disclosed in the dependent claims.

The disclosure is based on the idea of leaving a temporary structure in the middle of the broader gap, so that two temporary gaps are formed on opposing sides of the broader gap. These temporary gaps have substantially the same width as the narrow gap and they are etched in the same step as the narrow gap. An additional etching step is then performed to remove the temporary structure. An advantage of this method is that the sidewalls of the finished broad gap will not suffer from DRIE load effects.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

This disclosure describes a method for manufacturing a micromechanical structure in the structural layer of a wafer by forming a first gap and a second gap in the structural layer. The first gap has a first gap width and the second gap has a second gap width. The second gap width is greater than the first gap width.

The method comprises the following step: (1) depositing and patterning a first etching mask and a second etching mask on a horizontal face of the structural layer. The first etching mask has a first opening which defines the location and dimensions of the first gap. The width of the first opening is equal to the first gap width. The first opening forms a first unprotected area. The first etching mask also has a second opening which defines the location and dimensions of the second gap. The width of the second opening is equal to the second gap width.

The second etching mask comprises a load-reducing part within the second opening in the first etching mask. The load-reducing part divides the second opening into a temporarily protected area which is covered by the load-reducing part and at least one second unprotected area which is not covered by the load-reducing part. The width of the at least one second unprotected area is substantially equal to the width of the first opening.

The method also comprises the following steps: (2) etching trenches through the wafer in the first and second unprotected areas which are not protected by the first etching mask or the second etching mask, (3) coating at least the sidewalls of the trenches with a protective layer and removing the second etching mask at least from the second opening in the first etching mask, so that the temporarily protected area is exposed, and (4) etching away the structural layer in the exposed temporarily protected area.

The wafer may be a silicon wafer. The "structural layer" of the wafer may be a silicon layer where the mobile parts of a MEMS device are manufactured. The wafer may also comprise other layers. These other layers may for example provide support for the structural layer or contain contacts which facilitate electrical measurements. The structural layer may be etched after it is fixed to a support layer.

Figure 1:
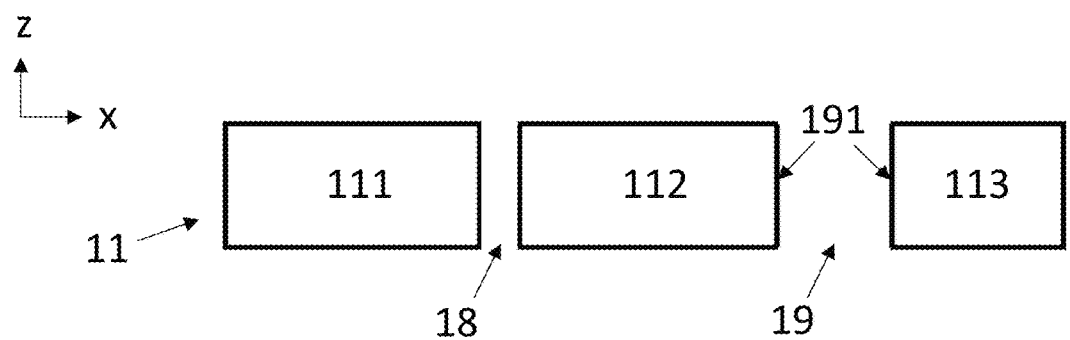
FIG. 1 illustrates a structural layer with a narrow gap and a broader gap.

The micromechanical parts which are separated from each other by the first gap in one region of the structural layer may be the same parts which are separated from each other by the second gap in another region of the wafer. Alternatively, the micromechanical parts which are separated from each other by the first gap may differ from the micromechanical parts which are separated from each other by the second gap. Alternatively, as FIG. 1 illustrates, a central part (112) may be separated from an adjacent part (111) on one side by the first gap and from another adjacent part (113) on the opposite side by the second gap. This last option will be the primary illustration in the figures of this disclosure, but the method can be equally well employed when the parts which are to be separated from each other by the first gap are distant and completely separate from the parts which are to be separated from each other by the second gap or when two parts are to be separate from each other by a narrow gap in one region of the xy-plane and by a broader gap in another region of the xy-plane.

Although only one first gap and one second gap will be discussed and illustrated in this disclosure, there could in practice be lots of gaps which have the same width as the first gap and lots of gaps which have the same width as the second gap. The expressions "a first gap" and "a second gap" could therefore alternatively be "at least one first gap" and "at least one second gap".

Furthermore, the first and second gaps will often be illustrated in this disclosure as substantially parallel elongated gaps, but their geometry and mutual orientation in the plane determined by the structural layer (the xy-plane) could be of any kind. The first gap could for example be perpendicular to the second gap, or it could be oriented at any angle in relation to the second gap. The shape of the first and/or second gaps may be rectangular or meandering, but these gaps could alternatively have any other shape. The first gap and second gap could also be concatenated—so that they together form an extended gap which is narrow in a first section and broader in a second section. This will be illustrated in the practical examples below.

In this disclosure the "width" of a gap refers to the smallest dimension of the gap in the xy-plane—not to its dimension in any particular direction.

The word "horizontal" refers in this disclosure to the plane defined by the structural layer, which is illustrated as the xy-plane. The z-axis, and words such as "vertical", "up" and "down", refer to the direction which is perpendicular to the horizontal plane. These words do not imply anything about how the wafer should be oriented during manufacturing or how a manufactured device should be oriented when it is used.

Figure 2A:
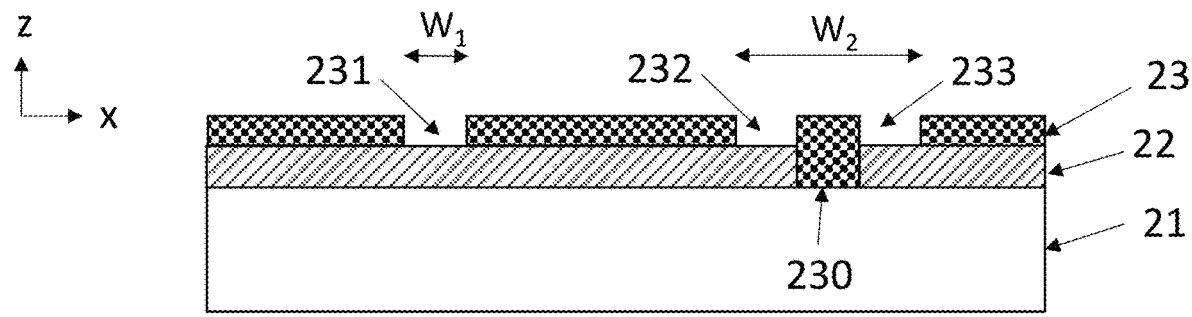
FIGS. 2a-2f illustrate a method for manufacturing a micromechanical structure.

FIG. 2a illustrates the first stage in the deposition and patterning of the first and second etching mask. 21 is structural layer. A first etching mask 22 has been deposited and patterned on the surface of the structural layer, and a second etching mask 23 has been deposited after the first etching mask. An opening in the first etching mask allows the second etching mask to form a load-reducing part 230 which reaches down to the surface of the structural layer 21. The second etching mask 23 is here used for completing the patterning the first etching mask 22—the material of the first etching mask 22 will be removed in regions defined by the gaps 231—233 in the second etching mask 23. It could alternatively be possible to complete the patterning of the first etching mask before the second etching mask is deposited and patterned.

Figure 2B:
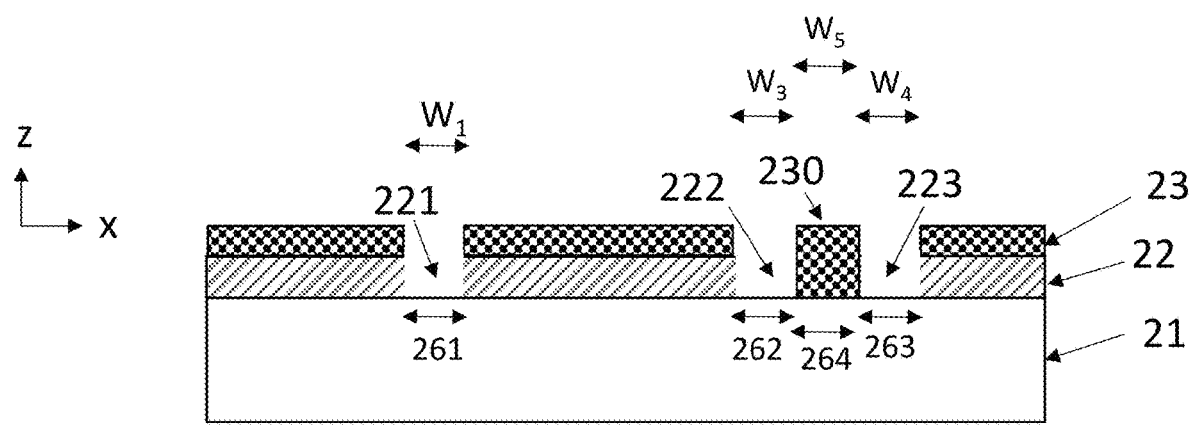

FIG. 2b illustrates the first and second etching masks after the patterning of the first etching mask 22 has been completed by removing the areas of the first etching mask 22 which lay under the gaps 231—233 in the second etching mask 23. In FIG. 2b the first etching mask 22 has a first opening 221 which defines a first unprotected area 261 on the surface of the structural layer 21, where the first gap will be formed. In other words, the area of the first opening on the horizontal face of the structural layer corresponds to the area where the first gap will be etched. The width $W_1$ of the first opening will determine the width of the first gap.

The first etching mask 22 also has a second opening—here formed by the two openings 222—223 and the intermediate space where the load-reducing part 230 of the second etching mask 23 is located. The area of the second opening on the horizontal face of the structural layer corresponds to the area where the second gap will be etched. The width of this second opening—which has been indicated with $W_2$ in FIG. 2, and which is equal to $W_3+W_5+W_4$ in FIG. 2b—will eventually determine the width of the second gap.

The load-reducing part 230 is formed from the material of the second etching mask 23, as described above. This part divides the surface of the structural layer within the second opening into a temporarily protected area 264 and two second unprotected areas 262 and 263. A temporary part 219 will be formed in the structural layer beneath the temporarily protected area 264.

By dimensioning the load-reducing part suitably, the DRIE load on the sidewalls of the second gap can be made as low as the DRIE load on the sidewalls of the first gap. This can be achieved by dimensioning the openings 222 and 223 so that the widths of the second unprotected areas 262 and 263 is at least approximately equal to the width of the first opening—in other words, $W_3 \approx W_1$ and $W_4 \approx W_1$. The width $W_1$ may for example be in the range 1 μm-10 μm, 1 μm-5 μm or 2 μm-5 μm.

Figure 2C:
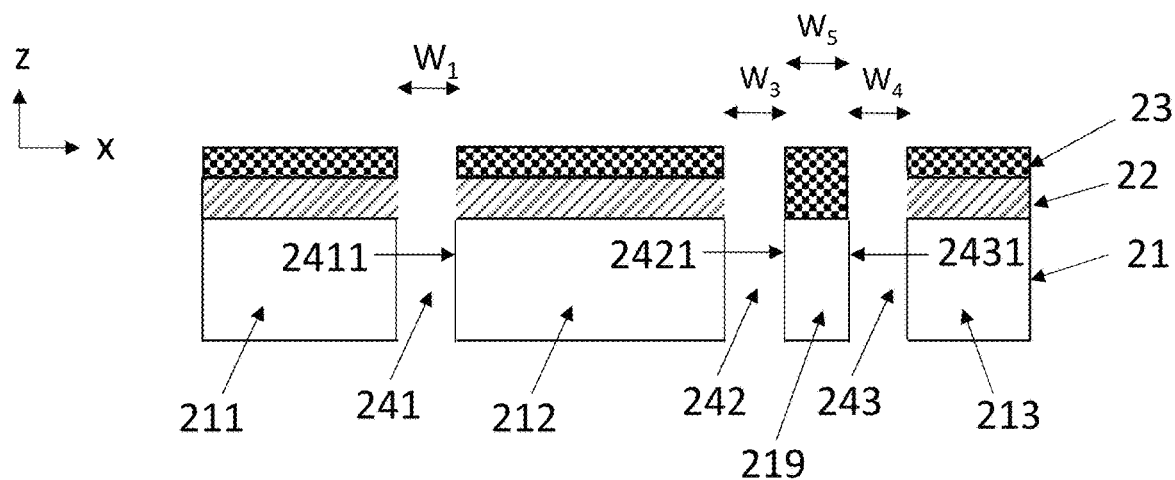

FIG. 2c illustrates the next step where trenches 241—243 is etched through the wafer in a DRIE etching process. Due to the fact that the widths of the trenches 241—243 are substantially equal, none of the sidewalls in these trenches will be subjected to a high DRIE load. The trench 241 is a permanent trench which will form the first gap which separates part 211 from part 212. It will remain at the width it has been given in FIG. 2c. Trenches 242 and 243, on the other hand, are temporary trenches in the sense that they will eventually be merged into the second gap which will separate part 212 from part 213. In other words, trenches 242 and 243 will form parts of the second gap. In FIG. 2c the structural layer still contains a temporary part 219 between the parts 212 and 213. This temporary part 219 will be removed later, as described below. The second gap will then be formed by trenches 242 and 243 and by the space between these trenches, i.e. the region which was occupied by temporary part 219 before it was removed.

Figure 2D:
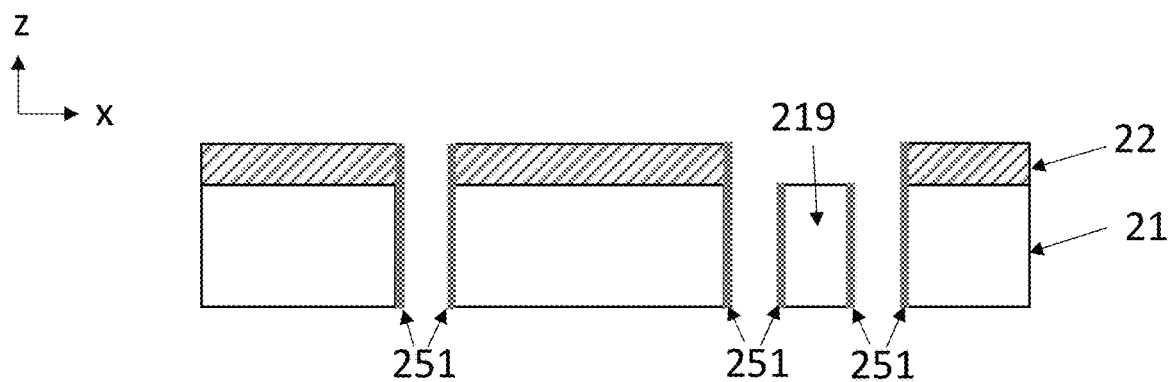

In the next step, illustrated in FIG. 2d, the second etching mask 23 is removed and the sidewalls of the trenches (such as 2411, 2421 and 2431) are coated with a protective layer 251. The second etching mask 23 may be removed before the sidewalls are coated, or the sidewalls may be coated before the second etching mask 23 is removed. The protective layer 251 can be made of any material which is suitable for deposition in narrow trenches, which is sturdy enough to withstand the subsequent etching step where temporary part 219 is removed, and which can be easily removed after that etching step. The protective layer 251 may for example be a silicon dioxide layer. It may for example be deposited in a chemical vapour deposition process where tetraethylorthosilicate (TEOS) is used as a precursor.

In the structural layer 21 illustrated in FIG. 2d, the second etching mask 23 has been removed and the sidewalls of the trenches have been coated with a protective layer 251. After the removal of the second etching mask 23, the temporarily protected area 264, which forms the top surface of the temporary part 219, is unprotected.

Figure 2E:
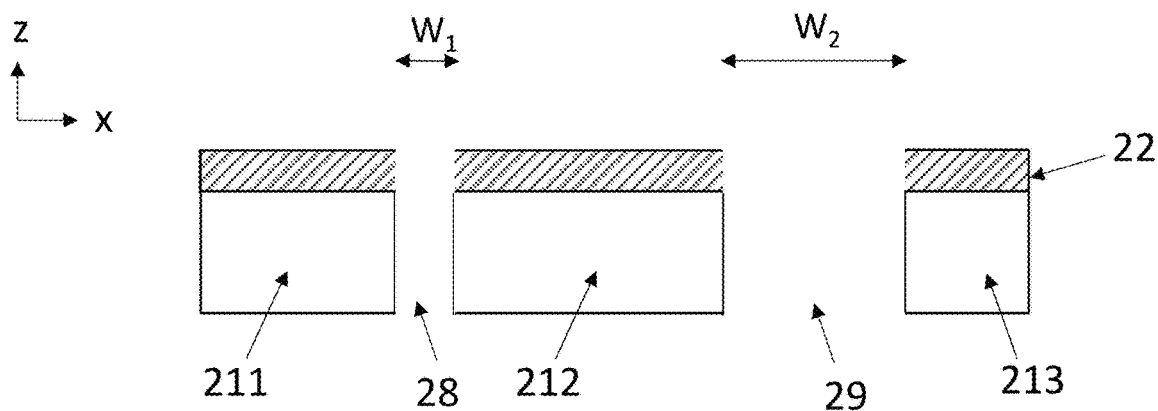

Finally, the temporary part 219 is removed. It may for example be removed in a DRIE etching process or a wet etching process. The sidewalls are protected by protective layer 251 during this step and will therefore not be damaged. FIG. 2e illustrates a device where the temporary part 219 has been completely removed, so that part 211 is separated from part 212 by a first gap 28 and part 212 is separated from part 213 by a second gap 29. The second gap 29 is wider than the first gap 28, but the sidewalls are intact in both gaps. The protective layer 251 has also been removed. The first mask 22 may be removed in a subsequent step.

Figure 2F:
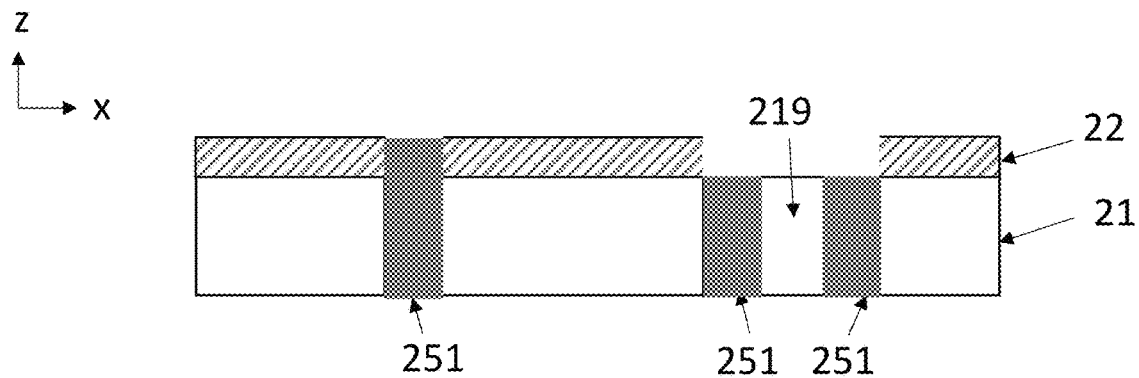

The step of coating at least the sidewalls of the trenches with a protective layer may comprise filling the trenches with the material of the protective layer. In other words, the protective layer 251 may be so thick that it fills the permanent trench 241 and the temporary trenches 242 and 243. This option is illustrated in FIG. 2f, which illustrates an alternative step which would follow the step illustrated in FIG. 2c (instead of the step swown in FIG. 2d). Here the protective layer 251 fills the trenches. The temporary part 219 is then removed with any of the methods mentioned above. After that, and after the protective layer 251 has been removed, the structure will be the same as in FIG. 2e.

The width $W_5$ of the load-reducing part 230—and the width of the underlying temporary part 219 of the structural layer—does not have to be close to equal to the width $W_1$ of the first opening 221 in the first etching mask 22. The load-reducing part 230 could alternatively be much wider than the first opening 221, as described below.

The load-reducing part may comprise a rectangular section on the horizontal face of the structural layer. The load-reducing part may comprise of one rectangle on the horizontal face of the structural layer. This rectangle may extend from a first edge of the second opening to an opposing second edge of the second opening.

Figure 3A:
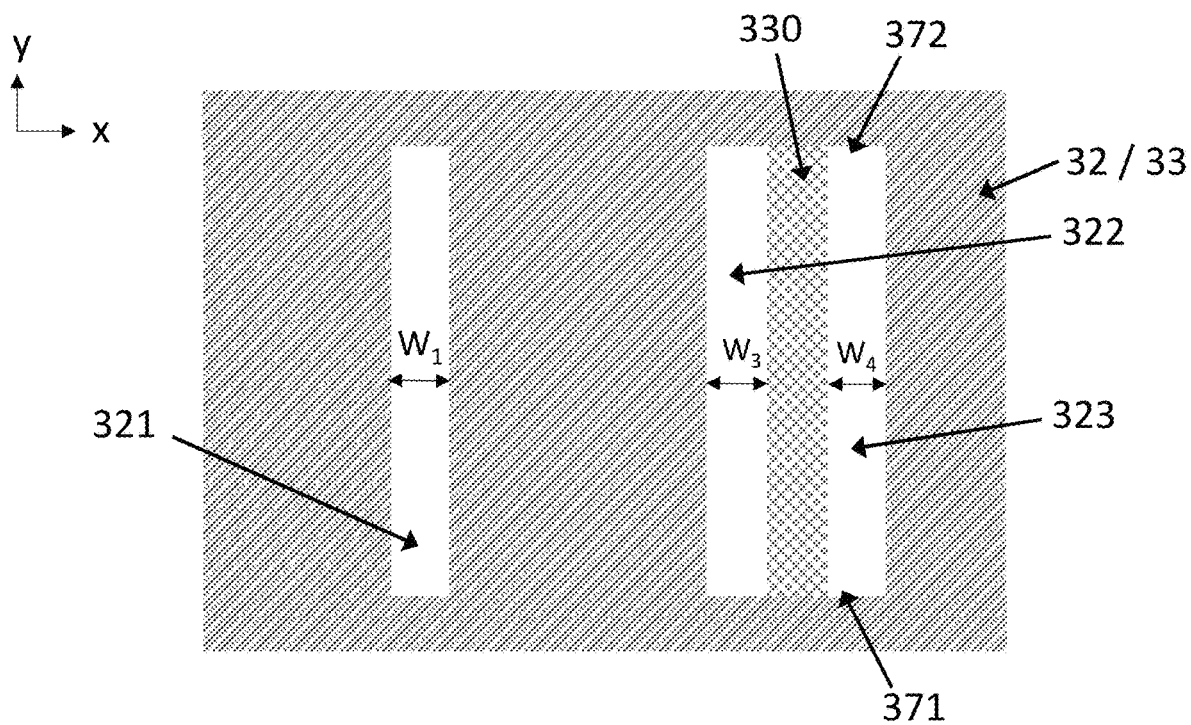
FIGS. 3a-3g illustrate schematically various possibilities for the first and the second mask pattern in the horizontal plane.

FIG. 3a illustrates a part of the horizontal face of the structural layer in the xy-plane, with the first and second mask on top. Reference numbers 32, 33, 321-323 and 330 correspond to reference numbers 22, 23, 221-223 and 230, respectively, in FIGS. 2a-2b. Reference number 32/33 indicates the area where at least the first etching mask 32 is present. The second etching mask 33 may lie on top of the first etching mask 32 in these areas, as FIG. 2b illustrates.

In FIG. 3a the second opening in the first etching mask 32 has a first edge 371 and an opposing second edge 372. The load-reducing part 330 extends from the first edge 371 to the second edge 372. In the illustrated case, the load-reducing part has been placed substantially in the middle of the second opening, so that the at least one second unprotected area here comprises two rectangular unprotected areas on opposing sides of the load-reducing part, illustrated by the openings 322 and 323 between the load-reducing part 330 and the first etching mask 32.

Figure 3B:
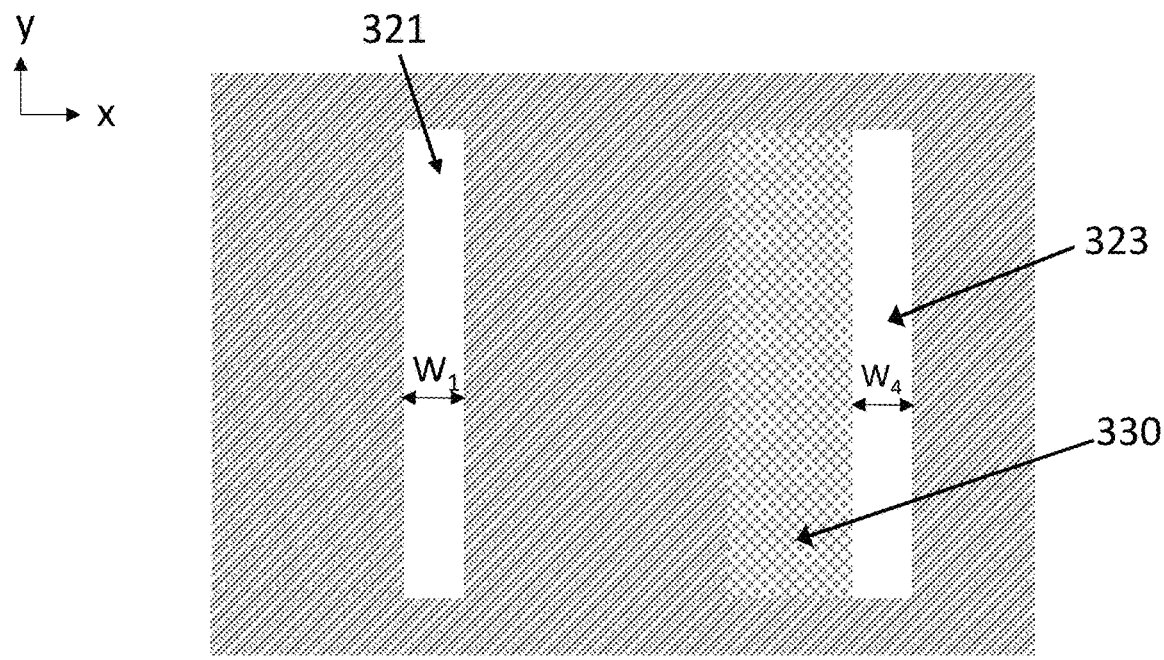

The load-reducing part could alternatively extend from the first edge 371 to the second edge 372 along one side of the second opening, instead of in the middle. This is illustrated in FIG. 3b. The at least one second unprotected area is in this case one rectangular area which lies next to the load-reducing part 330, illustrated by gap 323. The difference between the arrangement illustrated in FIG. 3a and the one illustrated in FIG. 3b is that in FIG. 3a both the left and right sidewalls of the second gap (that is, the sidewalls which lie opposed to each other in the x-direction) will be etched with a DRIE load which is as low as the load on the sidewalls in the first gap. In contrast, in FIG. 3b only the sidewall on the right will be etched with this low DRIE load. This may be acceptable if the quality of the left sidewall is not important.

Figure 3C:
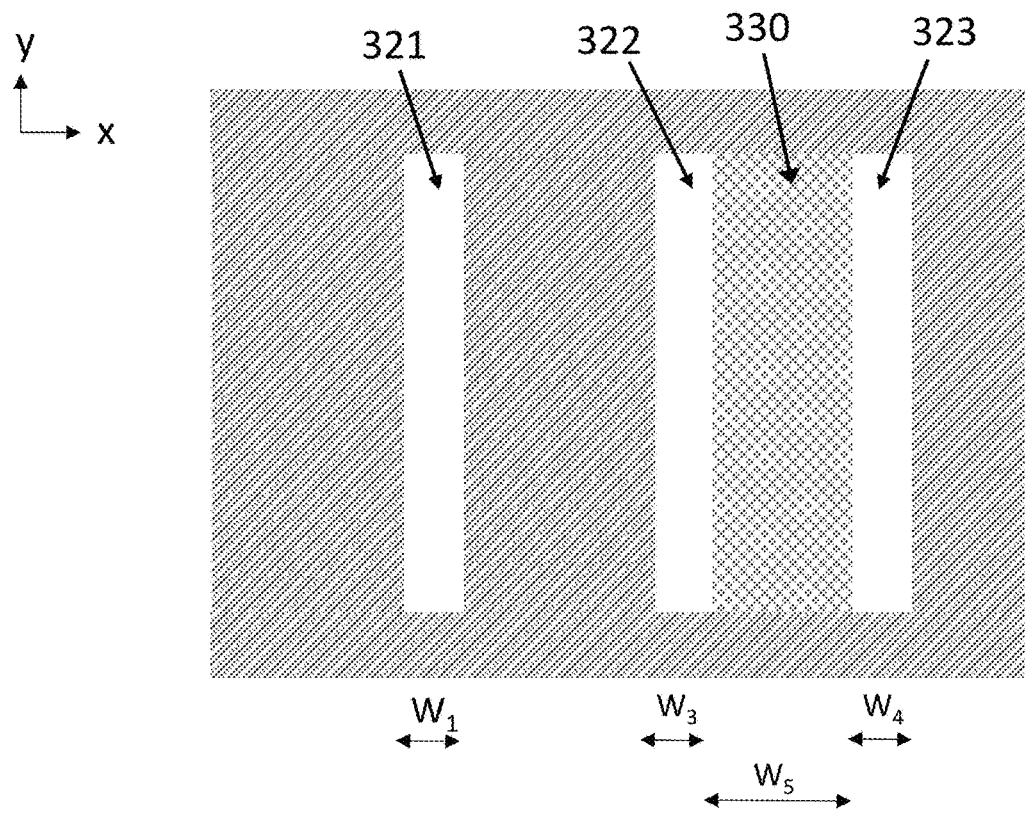

As illustrated in FIG. 3b, the load-reducing part 330 may be much wider than the first gap. FIG. 3c illustrates an option where a wide load-reducing part 330 is placed in the middle of the second opening. As FIG. 3c illustrates, the load-reducing part 330 may be wider than the sum of the widths of the adjacent openings 322 and 323 ($W_5 > W_3 + W_4$). On the other hand, the load reducing part could alternatively be narrower than either of the openings 322 and 323 ($W_5 < W_3$ and $W_5 < W_4$). These width options apply to all embodiments presented in this disclosure.

The load-reducing part may alternatively comprise of one rectangle on the horizontal face of the structural layer, wherein the rectangle extends from a first edge of the second opening to a first point inside the second opening. The distance from the first point to a second edge of the second opening, which is opposite to the first edge, may be substantially equal to the width of the first opening.

Figure 3D:
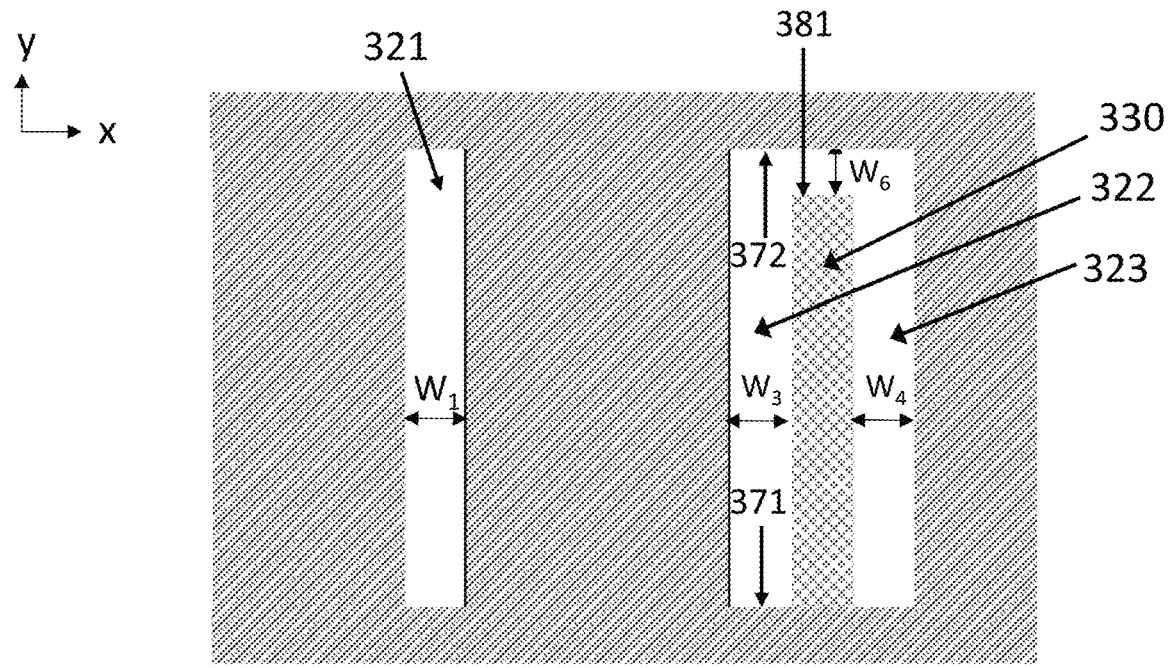

FIG. 3d illustrates a device where the load-reducing part 330 is a rectangle which extends from the first edge 371 toward the second edge 372, not to all the way to the second edge. Instead it ends at a first point. If the distance $W_6$ is substantially equal to the width $W_1$, the sidewall which will be formed under the second edge 372 of the second opening will also be subjected only to a low DRIE load, comparable to the load on the sidewalls of the first gap.

Figure 3E:
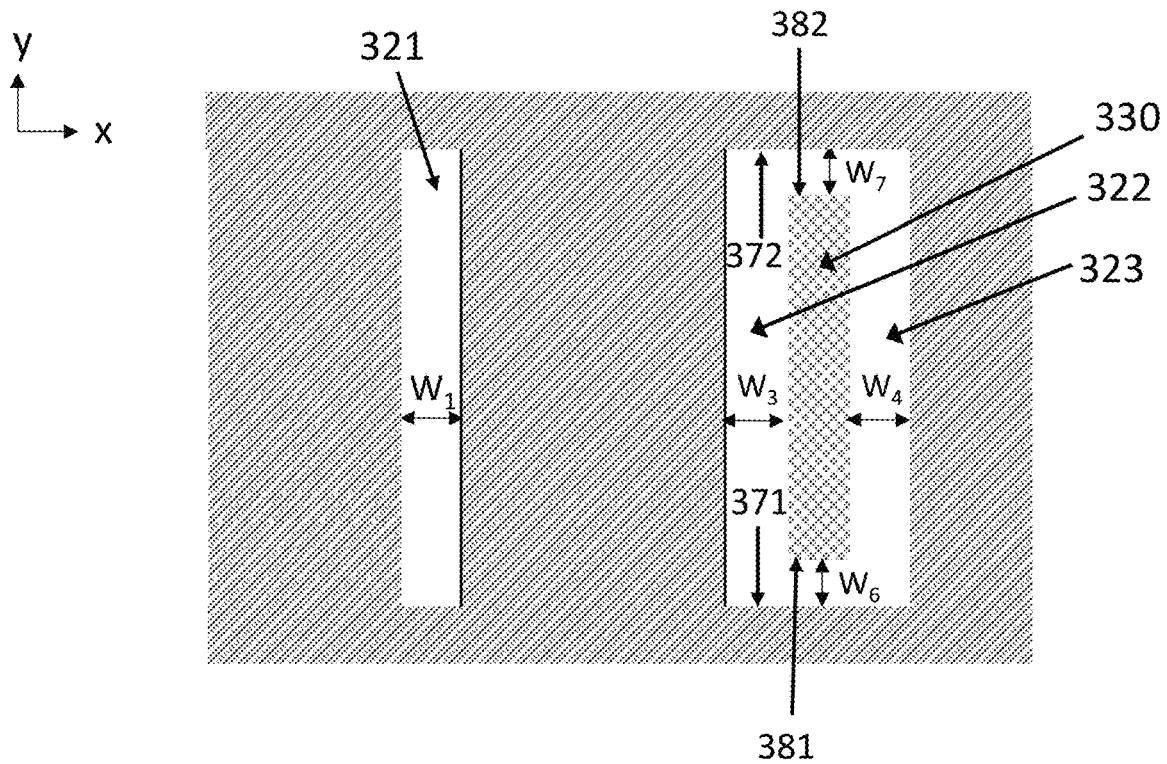

This method can also be extended to the sidewall formed under the first edge 371, as FIG. 3e illustrates. The load-reducing part 330 here comprises one rectangle on the horizontal face of the structural layer, wherein the rectangle extends from a first point 381 inside the second opening to a second point 382 inside the second opening. Both the distance ($W_6$) from the first point 381 to a first edge 371 of the second opening and the distance ($W_7$) from the second point 382 to a second edge 372 of the second opening, which is opposite to the first edge, may be substantially equal to the width ($W_1$) of the first opening.

Figure 3F:
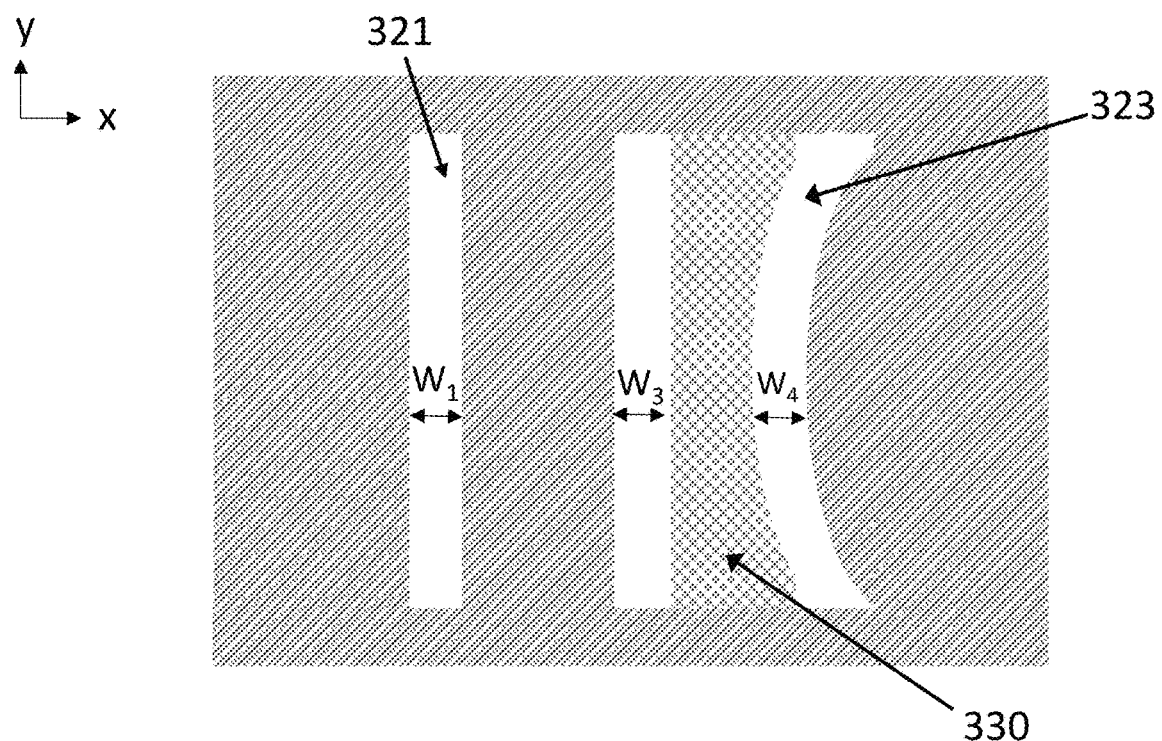

The load-reducing part may alternatively or complementarily comprise a convex section and/or a concave section on the horizontal face of the structural layer. In other words, one or both sides of the load-reducing part could in some places have a convex or concave shape. FIG. 3f illustrates a load-reducing part 330 which has a straight edge on the left side and a concave shape on the right side. Here the right-hand edge of the second opening has a convex shape, and the concave shape of the load-reducing part 330 allows the width $W_4$ to be equal to the width $W_1$ of the first opening along the edge.

Figure 3G:
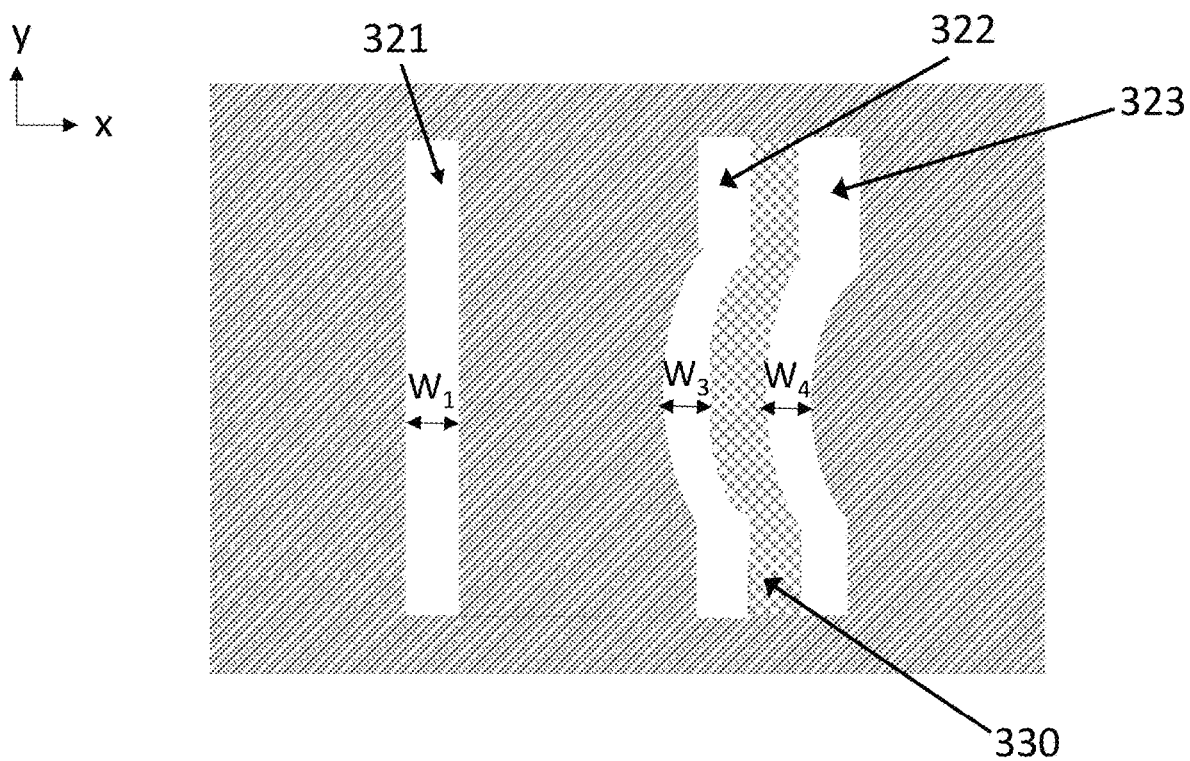

The load-reducing part can alternatively have any other geometry which is determined by the features of the second opening in the xy-plane. FIG. 3g illustrates a load-reducing part 330 which comprises two straight sections and a bent section which accommodates the convex and concave edges of the second opening so that the widths $W_3$ and $W_4$ remain substantially equal to the width $W_1$.

Figure 4:
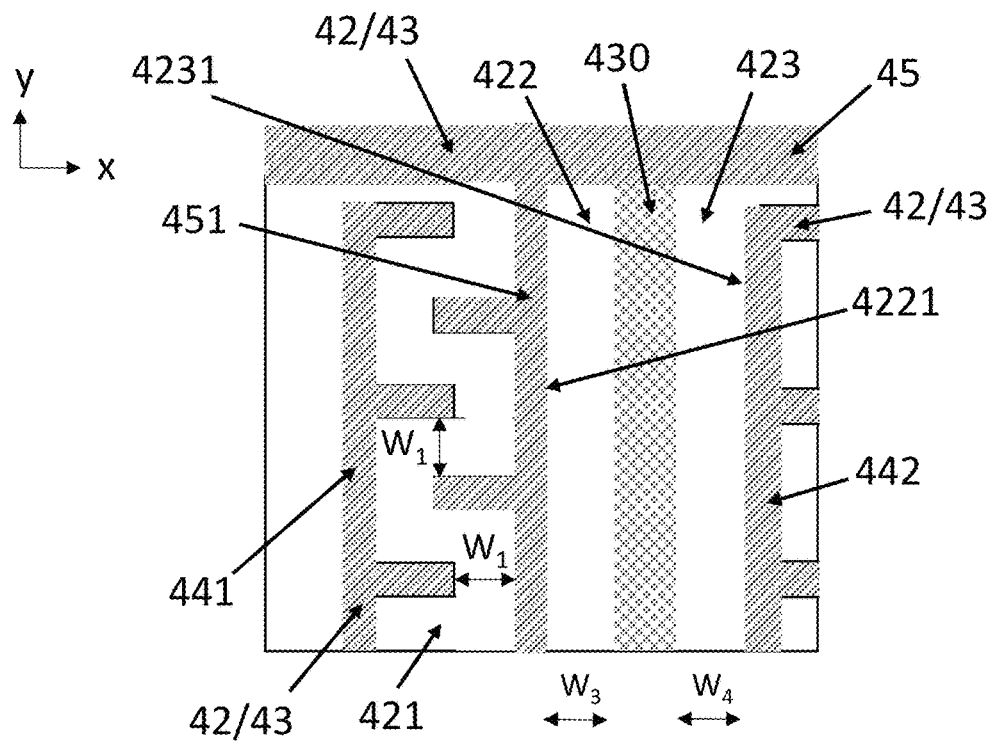
FIG. 4 illustrates a first practical example.

FIG. 4 illustrates a first practical example. The micromechanical structures in the structural layer here comprise a mobile rotor and a fixed stator. Interdigitated comb structures prepared in the structural layer to measure the movement of the rotor in relation to the stator. Only a small part of the device is illustrated in FIG. 4. Reference numbers 42, 43, 421, 422, 423 and 430 correspond to reference numbers 32, 33, 321, 322, 323 and 330, respectively, in FIGS. 3a-3g. The first etching mask 42 comprises areas which define the stator 45, first and second rotor electrodes 441—442 and a first stator electrode 451 which is paired with the first rotor electrode 441. The second rotor electrode 442 is in turn paired with a second stator electrode, which is not illustrated. The rotor electrodes extend from the rotor toward the stator 45. The rotor is not illustrated.

The first opening 421 will define a narrow gap between the first rotor electrode 441 and the first stator electrode 451. The second opening, on the other hand, which will be located in the area 422+423+430, will define a broader gap between the first stator electrode 451 and the second rotor electrode 442. By implementing a second etching mask 43 with a load-reducing part 430, and by dimensioning the widths $W_3$ and $W_4$ of openings 422 and 423 substantially equal to the width $W_1$ of the first opening 421, the sidewalls 4221 and 4231 of the electrodes can be protected from structural damage.

Figure 5:
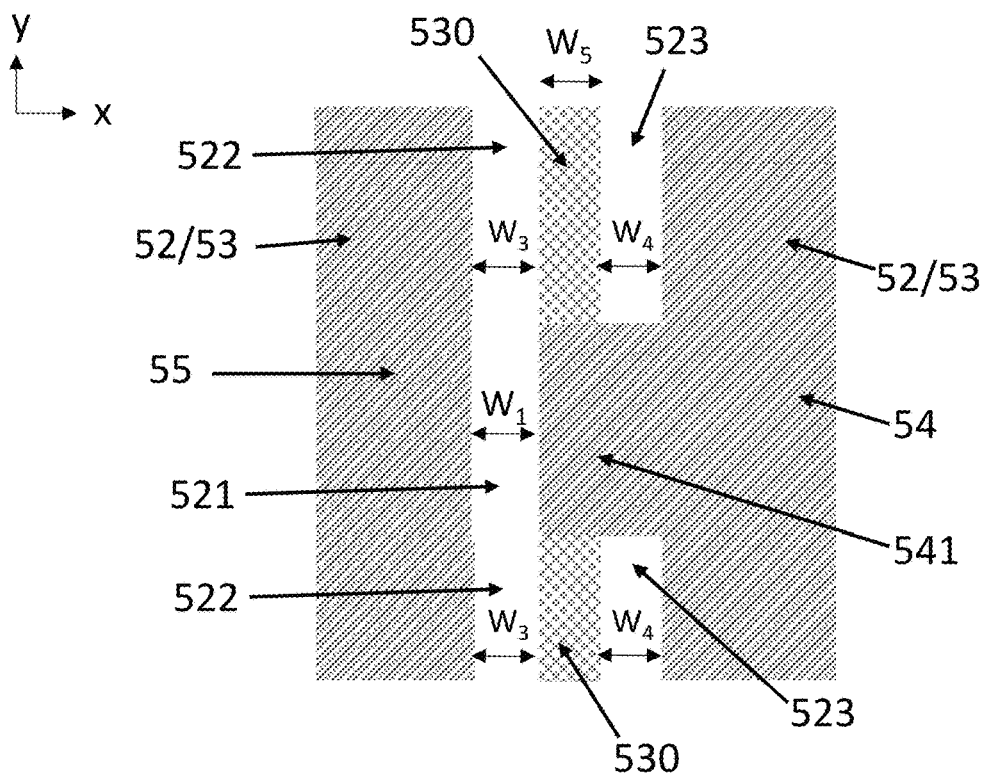
FIG. 5 illustrates a second practical example.

FIG. 5 illustrates a second practical example. The micromechanical structures in the structural layer here again comprise a mobile rotor and a fixed stator. Interdigitated comb structures prepared in the structural layer to measure the movement of the rotor in relation to the stator. Only a small part of the device is illustrated in FIG. 5. Reference numbers 52, 53, 521, 522, 523 and 530 correspond to reference numbers 32, 33, 321, 322, 323 and 330, respectively, in FIGS. 3*a*-3*g*. The first etching mask 52 comprises areas which define the rotor 54 and the stator 55. The rotor also comprises a motion limiter bump 541. If the rotor moves toward the stator, the motion limiter bump 541 will make contact with the stator 55 before any other part of the rotor 54 touches the stator 55. Such motion limiter bumps are used to prevent short-circuits and structural damage for example in situations where the MEMS device is subjected to a sudden external shock.

In this example the first gap and the second gap are concatenated. Together they separate the rotor 54 from the stator 55. The first opening 521 defines the first gap which will be the motion limiter gap where the rotor 54 is designed to first come into contact with the stator 55. The second opening, which, as before, will be formed by openings 522 and 523 and the region covered by the load-reducing part 530 after the temporary structure has been removed, defines the second gap which will be broader than the first. The widths $W_3$ and $W_4$ of openings 522 and 523 is substantially equal to the width $W_1$ of the first opening 521, so the sidewalls of the rotor and stator will not be damaged.

The invention claimed is:

1. A method for manufacturing a micromechanical structure in a structural layer of a wafer by forming a first gap and a second gap in the structural layer so that the first gap has a first gap width and the second gap has a second gap width, wherein the second gap width is greater than the first gap width, and the method comprises:

depositing and patterning a first etching mask and a second etching mask on a horizontal face of the structural layer, wherein the first etching mask has a first opening which defines the location and dimensions of the first gap, so that the width of the first opening is equal to the first gap width and the first opening forms a first unprotected area, the first etching mask has a second opening which defines the location and dimensions of the second gap, so that the width of the second opening is equal to the second gap width, and wherein the second etching mask comprises a load-reducing part within the second opening in the first etching mask, so that the load-reducing part divides the second opening into a temporarily protected area which is covered by the load-reducing part and at least one second unprotected area which is not covered by the load-reducing part, wherein the width of the at least one second unprotected area is substantially equal to the width of the first opening;

etching trenches through the structural layer in the first and second unprotected areas which are not protected by the first etching mask or the second etching mask;

coating at least the sidewalls of the trenches with a protective layer and removing the second etching mask at least from the second opening in the first etching mask, so that the temporarily protected area is exposed; and etching away the structural layer in the exposed temporarily protected area.

2. The method according to claim 1, wherein the load-reducing part comprises a rectangular section on the horizontal face of the structural layer.

3. The method according to claim 1, wherein the load-reducing part comprises one rectangle on the horizontal face of the structural layer, wherein the rectangle extends from a first edge of the second opening to an opposing second edge of the second opening.

4. The method according to claim 1, wherein the load-reducing part comprises one rectangle on the horizontal face of the structural layer, wherein the rectangle extends from a first edge of the second opening to a first point inside the second opening, so that the distance from the first point to a second edge of the second opening, which is opposite to the first edge, is substantially equal to the width of the first opening.

5. The method according to claim 1, wherein the load-reducing part comprises one rectangle on the horizontal face of the structural layer, wherein the rectangle extends from a first point inside the second opening to a second point inside the second opening, so that both the distance from the first point to a first edge of the second opening and the distance from the second point to a second edge of the second opening, which is opposite to the first edge, is substantially equal to the width of the first opening.

6. The method according to claim 1, wherein the load-reducing part comprises a convex section and/or a concave section on the horizontal face of the structural layer.

7. The method according to claim 1, wherein the step of coating at least the sidewalls of the trenches with a protective layer comprises filling the trenches with the material of the protective layer.

* * * * *